United States Patent
Uemura et al.

(10) Patent No.: US 7,375,463 B2
(45) Date of Patent: May 20, 2008

(54) OPTICAL DEVICE AND ORGANIC EL DISPLAY

(75) Inventors: Tsuyoshi Uemura, Kanazawa (JP); Satoshi Okutani, Ishikawa-gun (JP); Hirofumi Kubota, Kanazawa (JP); Muneharu Akiyoshi, Saitama (JP); Naotada Okada, Yokohama (JP); Junichi Tonotani, Yokohama (JP)

(73) Assignees: Kabushiki Kaisha Toshiba, Tokyo (JP); Toshiba Matsushita Display Technology Co., Ltd., Tokyo (JP)

( * ) Notice: Subject to any disclaimer, the term of this patent is extended or adjusted under 35 U.S.C. 154(b) by 0 days.

(21) Appl. No.: 11/269,837

(22) Filed: Nov. 9, 2005

(65) Prior Publication Data

US 2006/0055319 A1 Mar. 16, 2006

Related U.S. Application Data

(63) Continuation of application No. PCT/JP2004/011616, filed on Aug. 12, 2004.

(30) Foreign Application Priority Data

Aug. 13, 2003 (JP) .............................. 2003-293112

(51) Int. Cl.
*H05B 33/00* (2006.01)
*G09F 9/30* (2006.01)

(52) U.S. Cl. .................. 313/504; 313/506; 313/112; 313/113

(58) Field of Classification Search ............... 313/504, 313/506, 512, 113, 114; 428/917; 315/169.3; 345/45, 76
See application file for complete search history.

(56) References Cited

U.S. PATENT DOCUMENTS 5,982,092 A * 11/1999 Chen ........................ 313/512
6,630,684 B2 * 10/2003 Lee et al. .................... 257/40
6,727,646 B1 * 4/2004 Koyama et al. ............ 313/506
6,737,802 B2 * 5/2004 Koyama et al. ............ 313/506
6,768,260 B2 * 7/2004 Fukunaga et al. .......... 313/506
6,787,796 B2 * 9/2004 Do et al. ..................... 257/40
6,861,800 B2 * 3/2005 Tyan et al. .................. 313/506
6,936,964 B2 * 8/2005 Cok ........................... 313/512
2002/0011978 A1 * 1/2002 Yamazaki et al. ............ 345/87
2002/0043931 A1 * 4/2002 Minoura et al. ............ 313/506

FOREIGN PATENT DOCUMENTS

| JP | 4-328294 | 11/1992 |
|---|---|---|
| JP | 11-283751 | 10/1999 |
| JP | 2000-284726 | 10/2000 |
| JP | 2001-291595 | 10/2001 |
| JP | 2001-319789 | 11/2001 |
| JP | 2002-8868 | 1/2002 |
| JP | 2002-62856 | 2/2002 |
| JP | 2002-158095 | 5/2002 |
| JP | 2003-109749 | 4/2003 |
| JP | 2003-257620 | 9/2003 |
| JP | 2004-296429 | 10/2004 |
| KR | 2002-0091787 | 12/2002 |

\* cited by examiner

*Primary Examiner*—Ashok Patel
(74) *Attorney, Agent, or Firm*—Oblon, Spivak, McClelland, Maier & Neustadt, P.C.

(57) ABSTRACT

An optical device includes a first waveguide layer in which multiple-beam interference occurs, a second wavelength layer which includes a back surface facing the first waveguide layer and a front surface as a light output surface, and an outcoupling layer which is disposed on a back side of the second waveguide layer and faces the first wave guide layer, wherein the outcoupling layer includes a first portion as a layer with light transmission property and second portions which are dispersed in the first portion and differ in optical property from the first portion, and wherein an array of the second portions forms a triangular lattice.

15 Claims, 5 Drawing Sheets

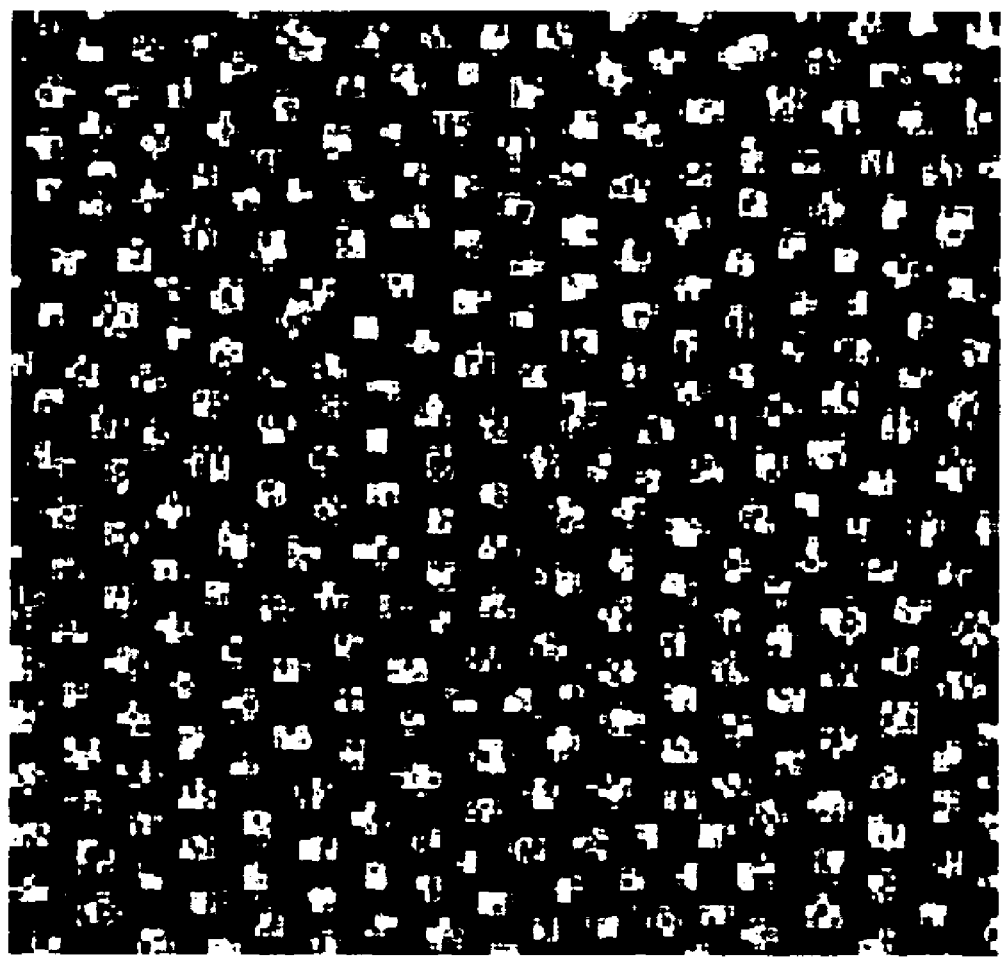
F I G. 10

OPTICAL DEVICE AND ORGANIC EL DISPLAY

CROSS-REFERENCE TO RELATED APPLICATIONS

This is a Continuation Application of PCT Application No. PCT/JP2004/011616, filed Aug. 12, 2004, which was published under PCT Article 21(2) in Japanese.

This application is based upon and claims the benefit of priority from prior Japanese Patent Application No. 2003-293112, filed Aug. 13, 2003, the entire contents of which are incorporated herein by reference.

BACKGROUND OF THE INVENTION

1. Field of the Invention

The present invention relates to an optical device such as an organic EL (electroluminescent) display.

2. Description of the Related Art

Since organic EL displays are of self-emission type, they have a wide viewing angle and a high response speed. Further, they do not require a backlight, and therefore, low profile and light weight are possible. For these reasons, the organic EL displays are attracting attention as a display which substitutes the liquid crystal display. However, the conventional organic EL displays entail the drawback of a low luminous efficiency.

BRIEF SUMMARY OF THE INVENTION

It is an object of the present invention to increase the outcoupling efficiency of an optical device such as an organic EL display.

According to the first aspect of the present invention, there is provided an optical device comprising a first waveguide layer in which multiple-beam interference occurs, a second wavelength layer which comprises a back surface facing the first waveguide layer and a front surface as a light output surface, and an outcoupling layer which is disposed on a back side of the second waveguide layer and faces the first wave guide layer, wherein the outcoupling layer comprises a first portion as a layer with light transmission property and second portions which are dispersed in the first portion and differ in optical property from the first portion, and wherein an array of the second portions forms a triangular lattice.

According to the second aspect of the present invention, there is provided an organic EL display comprising an organic EL element which comprises a front electrode, a back electrode facing the front electrode, and an organic layer interposed between the front and back electrodes and including an emitting layer, an insulating layer with light transmission property which comprises a back surface facing the front electrode and a front surface as a light output surface, and an outcoupling layer which is disposed on a back side of the insulating layer and faces the organic EL element, wherein the outcoupling layer comprises a first portion as a layer with light transmission property and second portions which are dispersed in the first portion and differ in optical property from the first portion, and wherein an array of the second portions forms a triangular lattice.

According to the third aspect of the present invention, there is provided an optical device comprising a first waveguide layer in which light propagates, a second waveguide layer which comprises a back surface facing the first waveguide layer and a front surface as a light output layer, and an outcoupling layer which is disposed on a back side of the second waveguide layer and faces the first waveguide layer, wherein the outcoupling layer is an aggregation of diffraction patterns which guides light in the first waveguide layer to the second waveguide layer.

According to the fourth aspect of the present invention, there is provided an organic EL display comprising an organic EL element which comprises a front electrode, a back electrode facing the front electrode, and an organic layer interposed between the front and back electrodes and includes an emitting layer, an insulating layer with light transmission property which comprises a back surface facing the front electrode and a front surface as a light output surface, and an outcoupling layer which is disposed on a back side of the insulating layer and faces the organic EL element, wherein the outcoupling layer comprises a first portion as a layer with light transmission property and second portions which differ in optical property from the first portion, and wherein an array of the second portions forms a triangular lattice.

According to the fifth aspect of the present invention, there is provided an organic EL display comprising an organic EL element which comprises a front electrode, a back electrode facing the front electrode, and an organic layer interposed between the front and back electrodes and includes an emitting layer, an insulating layer with light transmission property which comprises a back surface facing the front electrode and a front surface as a light output surface, and an outcoupling layer which is disposed on a back side of the insulating layer and faces the organic EL element, wherein the outcoupling layer comprises a first portion as a layer with light transmission property and second portions which differ in optical property from the first portion.

BRIEF DESCRIPTION OF THE SEVERAL VIEWS OF THE DRAWING

FIG. 10 is an atomic force microscope photograph of the outcoupling layer of an organic EL display according to an example of the present invention.

DETAILED DESCRIPTION OF THE INVENTION

Embodiments of the present invention will be described with reference to accompanying drawings. Through out the drawings, structural elements that have similar or analogous functions are designated by the same reference symbols, and a repetitive explanation thereof will be omitted.

Figure 1:
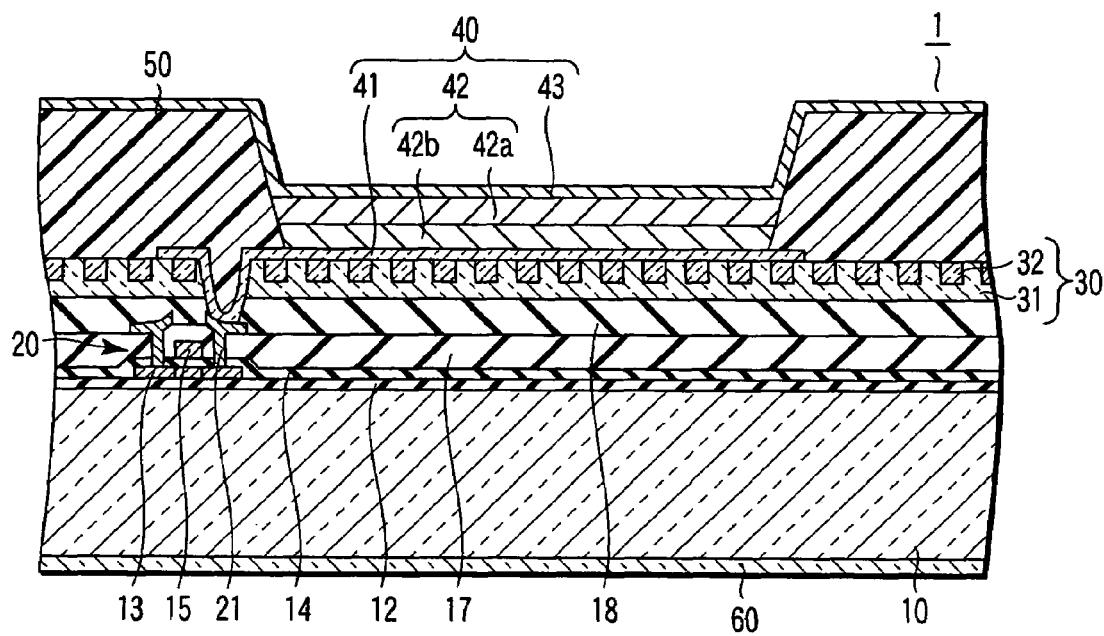
FIG. 1 is a sectional view schematically showing a portion of an organic EL display according to the first embodiment of the present invention.

FIG. 1 is a cross sectional view schematically showing a part of an organic EL display according to the first embodiment of the present invention. FIG. 1 shows, as an example of the optical device, a self-emission device, more specifically, an organic EL display 1. In FIG. 1, the organic EL display 1 is illustrated such that its display surface, that is, the front surface or light outputting surface, faces downward and the back surface faces upward.

The organic EL display 1 is a bottom emission type organic EL display which employs an active matrix drive method. The organic EL display 1 includes a transparent substrate 10 such as a glass substrate as an insulating layer with light transmission property.

On the transparent substrate 10, pixels are arranged in a matrix form. Each pixel includes, for example, an element control circuit (not shown), an output switch 20, an organic EL element 40, which are connected in series between a pair of power source terminals, and a pixel switch (not shown). The control terminal of the element control circuit is connected to a video signal line (not shown) via a pixel switch. The element control circuit outputs a current, which has a magnitude corresponding to a video signal supplied from the video signal line, to the organic EL element 40 through the output switch 20. The control terminal of the pixel switch is connected to a scan signal line (not shown), and the ON/OFF operation thereof is controlled in accordance with a scan signal supplied from the scan signal line. Note that other structures can be employed for the pixels.

On the substrate 10, as an undercoat layer 12, for example, an $SiN_x$ layer and an $SiO_x$ layer are arranged in this order. A semiconductor layer 13 such as a polysilicon layer in which a channel, a source and a drain are formed, a gate insulator 14 which can be formed with use of, for example, TEOS (tetraethyel orthosilicate), and a gate electrode 15 made of, for example, MoW, are arranged in this order on the undercoat layer 12, and these layers form a top gate-type thin film transistor (referred to as a TFT hereinafter). In this example, the TFTs are used as TFTs of the pixel switch 20, output switch and element control circuit. Further, on the gate insulator 14, scan signal lines (not shown) which can be formed in the same step as that for the gate electrode 15 are arranged.

An interlayer insulating film 17 made of, for example, $SiO_x$ which is deposited by a plasma CVD method, is arranged on the gate insulator 14 and gate electrode 15. Source and drain electrodes 21 are arranged on the interlayer insulating film 17, and they are buried in a passivation film 18 made of, for example, $SiN_x$. The source and drain electrodes 21 have a three-layer structure of, for example, Mo/Al/Mo, and electrically connected to the source and drain of the TFT via contact holes formed in the interlayer insulating film 17. Further, on the interlayer insulating film 17, video signal lines (not shown) which can be formed in the same step as that for the source and drain electrodes 21 are arranged.

An outcoupling layer 30 is arranged on the passivation film 18. The outcoupling layer 30 includes a first portion 31 which is a layer with light transmission property and second portions 32 which are dispersed in the first portion 31 and differ in optical properties from the first portion 31. In this example, the outcoupling layer 30 is formed of the first portion 31 and the second portions 32 which fill recessed portions formed in the first portion and differ in optical properties from the first portion 31. Typically, the surface of the outcoupling layer 30 is flat. Further, a through hole which communicates with the drain electrode 21 is formed in the passivation film 18 and the outcoupling layer 30.

With use of the outcoupling layer 30, the path of the light which propagates in a layer can be changed. In other words, by properly designing the outcoupling layer 30, the light which is confined within a layer due to multiple reflection, and the light which is output from the above described layer in an improper direction and cannot contribute to the display can be output in a desired direction.

As described above, in an optical device in which the first waveguide layer and the second waveguide layer are arranged in this order from the back side, the light which cannot contribute to the display for such a reason that it is confined within the first waveguide layer can be output to the external environment by arranging the outcoupling layer 30. Note that, in this example, the first waveguide layer corresponds to a laminate of a front electrode 41 and an organic layer 42, and the second waveguide layer corresponds to the substrate 10.

Front electrodes 41 with light transmission property are juxtaposed on the outcoupling layer 30 and spaced apart from one another. In this example, the front electrodes 41 are anodes and made of, for example, a transparent conductive oxide such as ITO (indium tin oxide). The front electrode 41 is electrically connected to the drain electrode 21 via a through hole formed in the passivation film 18 and the outcoupling layer 30.

Further, a partition insulating layer 50 is arranged on the outcoupling layer 30. The partition insulating layer 50 is provided with a through hole at a position corresponding to the front electrode 41. The partition insulating layer 50 is, for example, an organic insulating layer, and can be formed with use of a photolithography technique.

On the portion of the front electrode 41 which is exposed to the inside of the through hole formed in the partition insulating layer 50, an organic layer 42 which includes an emitting layer 42a is arranged. The emitting layer 42a is a thin film containing a luminescent organic compound which can generate a color of, for example, red, green or blue. The organic layer 42 can further contain layers other than the emitting layer 42a. For example, the organic layer 42 can further contain a buffer layer 42b which serves to mediate the injection of positive holes from the front electrode 41 into the emitting layer 42a. The organic layer 42 can further contain a hole transporting layer, a hole blocking layer, an electron transporting layer, an electron injection layer, etc.

A back electrode 43 with light-reflection property is arranged on the partition insulating layer 50 and organic layer 42. In this example, the back electrode 43 is a cathode which is continuously formed and common to all pixels. The back electrode 43 is electrically connected to the electrode wiring, the electrode wiring being formed on the layer on which the video signal lines are formed, via a contact hole (not shown) formed in the passivation film 18, the outcoupling layer 30 and the partition insulating layer 50. Each organic EL element 40 includes the front electrode 41, organic layer 42 and back electrode 43.

Note that the organic EL display 1 shown in FIG. 1 usually further includes a sealing substrate facing the back electrode 43, and a sealing layer (not shown) formed along the periphery of the surface of the sealing substrate which faces back electrode 43, and with this structure, an enclosed space is formed between the back electrode 43 and sealing substrate. This space can be filled with, for example, a noble gas such as Ar gas or an inert gas such as $N_2$ gas.

The organic EL display 1 further includes a light scattering layer 60 on an outer side of the transparent substrate 10, that is, on the front side or light-emitting side. A polarizing plate may be arranged between the transparent substrate 10 and the light-scattering layer 60. An ND (neutral density) filter may be arranged on the light scattering layer 60.

The present inventors conducted intensive researches to increase the luminous efficiency of organic EL displays, and have found the following facts.

The luminous efficiency of an organic EL display is greatly influenced not only by the outcoupling efficiency of the organic EL element, but also by some other factors. More specifically, even if light can be output from an organic EL element at a high efficiency, the luminous efficiency of the organic EL display cannot be increased to a sufficient level as long as light cannot be output at a high efficiency from a light transmitting insulating layer arranged on the front side of the organic EL element. In other words, in order to increase the luminous efficiency of the organic EL display, it is necessary to sufficiently prevent the light incident on the light transmitting insulating layer from being totally reflected on an interface between the light transmitting insulating layer and an external environment, typically the atmosphere. That is, it is important to suppress that the light output from the first waveguide layer, which is the laminate of the front electrode 41 and organic layer 42 in this example, and entered into the second waveguide layer, which is a light transmitting insulating layer such as the substrate 10 in this example, is totally reflected by the light outputting surface of the second waveguide layer.

According to the researches made by the present inventors, it has been found that in order to sufficiently prevent the light entered into the light transmitting insulating layer from being totally reflected by the interface between the light transmitting insulating layer and the external environment, the light should be made incident on the light transmitting insulating layer at an angle equal to or smaller than the critical angle at the interface between the light transmitting insulating layer and the external environment, and the directivity of the light should be extremely high. More specifically, the directivity of the light should be enhanced to such a level that the use of the light scattering layer becomes necessary in order to achieve a sufficient viewing angle. In order to enhance the directivity of the light incident on the light transmitting insulating layer with use of a diffraction grating, it is necessary to set the grating constant to a very small value.

Note that the emitting layer of the organic EL element emits light in all directions. Therefore, it is originally not necessary to arrange a light scattering layer to achieve a wide viewing angle in organic EL displays. Based on such a background, the conventional organic EL displays do not use a light scattering layer or output light with a high directivity from a light transmitting insulating layer arranged on an observer side with regard to the organic EL element.

In order to enhance the directivity of light output from an organic EL element, for example, a diffraction grating can be used. However, as will be described later with reference to FIG. 2, in order to sufficiently enhance the directivity of light to be incident on a light transmitting insulating layer by using a diffraction grating, the grating constant needs to be very small. A diffraction grating having such a small grating constant is very difficult to manufacture.

Further, the present inventors have found that multiple reflection and multiple interference, that is, "multiple-beam interference" need be considered. The "multiple-beam interference" is an interference which occurs as some of light rays are repeatedly reflected between reflecting surfaces, that is, parallel plane-like reflecting surfaces.

Multiple-beam interference occurs in a very thin layer such as the laminate of the front electrode 41 and organic layer 42. Of the light that travels within the laminate, a light beam which travels in a certain direction is enhanced, whereas a light beam which travels in another direction is weakened. In other words, the traveling direction of the light which propagates in an in-plane direction while repeatedly reflected between both main surfaces of the laminate is regulated. Therefore, of the lights which propagate in the in-plane direction while repeatedly reflected in the above described laminate, the light with the maximum intensity is particularly important to effectively utilize in order to improve the luminous efficiency of the organic EL display.

Figure 2:
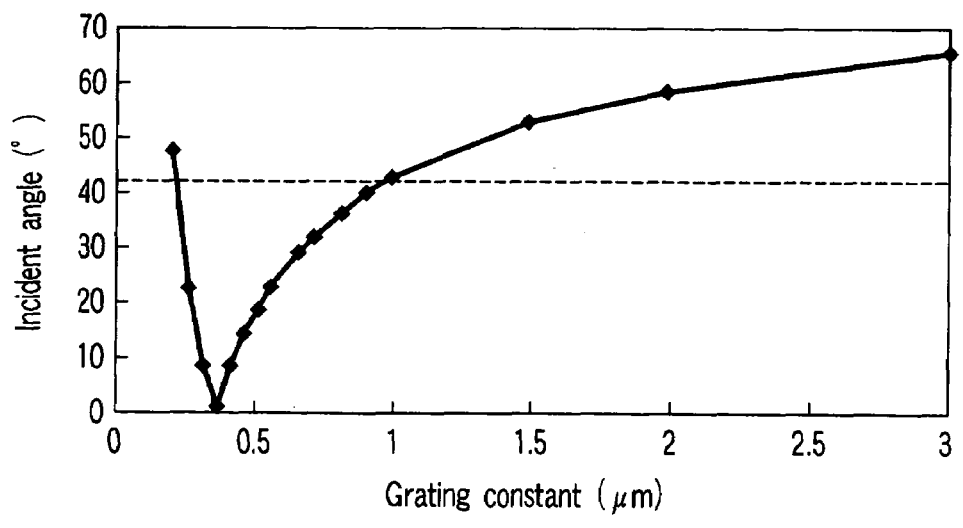
FIG. 2 is a graph showing the relationship between the grating constant of a diffraction grating and the incident angle of the first-order diffracted light on an interface between a transparent substrate and an external environment, in the case where the outcoupling layer is considered as a diffraction grating in the organic EL display shown in FIG. 1.

FIG. 2 is a graph showing the relationship between the grating constant of a diffraction grating and the incident angle of the first-order diffracted light on an interface between a transparent substrate 10 and an external environment, in the case where the outcoupling layer 30 is considered as a diffraction grating in the organic EL display shown in FIG. 1. In this figure, the abscissa represents the grating constant of the diffraction grating, whereas the coordinate represents the incident angle of the first-order diffracted light incident on the interface between the transparent substrate 10 and the external environment.

The data shown in FIG. 2 are obtained by performing a simulation under the following conditions. That is, in this simulation, the thickness of the laminate of the front electrode 41 and organic layer 42 was set to 150 nm, and the refractive index of the laminate was set to 1.55. Further, the organic layer 42 was of a type which emits light having a wavelength of 530 nm. Furthermore, a glass substrate was used as the transparent substrate 10, and the critical angle for the light which travels towards the external environment (the atmosphere) from the inside of the transparent substrate 10 was set to 41.3°.

Moreover, the multiple-beam interference in the laminate of the front electrode 41 and the organic layer 42 is considered, and, of the lights which propagate in the in-plane direction in the laminate, the light with the maximum intensity was used to calculate the diffraction by the diffraction grating 30. More specifically, based on the wavelength, thickness and refractive index of the laminate, of the lights which propagate in the in-plane direction in the laminate, the light with the maximum intensity was supposed to travel in a direction which made an angle of 63.7° with respect to the film surface, and the diffraction of the light by the diffraction grating 30 was calculated. Further, since the traveling direction of the O-order diffracted light was not changed and the diffracted light of a higher order than that of the first-order diffracted light was very weak, only the first-order diffracted light was considered here.

As shown in FIG. 2, in the case where the grating constant is greater than about 1 μm, the incident angle of the first-order diffracted light against the interface between the transparent substrate 10 and the external environment is equal to or greater than the critical angle. Therefore, in this case, the first-order diffracted light cannot be utilized for display.

In the case where the grating constant is in a range from about 1 µm to about 0.2 µm, the incident angle of the first-order diffracted light against the interface between the transparent substrate 10 and the external environment is smaller than the critical angle. In particular, when the grating constant is set in a range larger than 0.2 µm and less than 0.4 µm, the incident angle can be reduced to an extremely small value. When the grating constant is set to about 0.35 µm, the incident angle can be set to 0°.

Note that, in the case where the grating constant is less than about 0.2 µm, the incident angle of the first-order diffracted light against the interface between the transparent substrate 10 and the external environment is equal to or greater than the critical angle. Therefore, in this case, the first-order diffracted light cannot be utilized for display.

As described, in the case where the grating constant of the diffraction grating is very small, the incident angle of the first-order diffracted light against the interface between the transparent substrate 10 and the external environment can be made extremely small. In this case, of the lights which propagate in the film surface direction in the laminate, not only the light with the maximum intensity but also most of the lights with a lower intensity can have an incident angle smaller than the critical angle. Therefore, a great portion of the lights incident on the transparent substrate 10, which is a light transmitting insulating layer, can be output to the external environment. Accordingly, when the above described structure is employed, a high luminous efficiency can be realized.

In the meantime, as described above, a diffraction grating having a small grating constant is difficult to manufacture. In this embodiment, an outcoupling layer 30 which is obtained by utilizing the technique which will now be described is employed as an example.

FIGS. 3 to 8 are cross sectional views schematically showing an example of the method of manufacturing the outcoupling layer 30.

Figure 3:
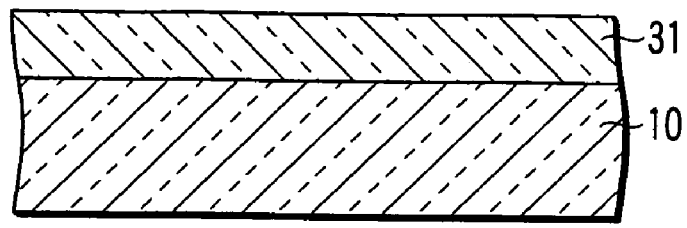
FIG. 3 is a cross sectional view schematically showing an example of the method of manufacturing an outcoupling layer.

In this method, first, a light transmitting layer, for example, SiN film, which will later be used as the first portion 31, is formed on a main surface of the substrate 10 as shown in FIG. 3.

Figure 4:
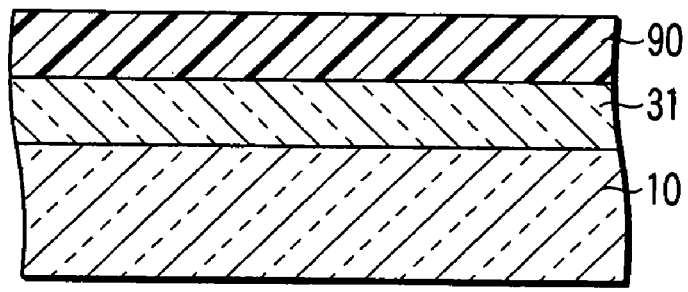
FIG. 4 is a cross sectional view schematically showing an example of the method of manufacturing an outcoupling layer.

Next, as shown in FIG. 4, an organic layer 90 is formed on the SiN film 31. The organic layer 90 is formed by the following manner. That is, a coating solution is prepared by, for example, dissolving a diblockcopolymer of polystyrene (PS) and poly methyl methacrylate (PMMA) into a solvent such as propylene glycol monomethyl ether acetate (PG-MEA) and applied on the SiN film 31, and thereafter, the solvent is removed from thus obtained coating film, thereby forming the layer.

Next, the organic layer 90 is annealed. The annealing is carried out within a temperature range from the glass transition temperature of the blockcopolymer to the order-disorder transition temperature. PMMAs which form the block polymer come close to one another, and thus island-like regions 91 made of PMMA and an ocean-like region 92 made of PS are produced in the organic layer 90. When, PMMA with a small dispersion in the molecular weight is used as the blockcopolymer, the island regions 91 will have a roughly spherical shape or columnar shape of about the same dimensions. The dimensions of the island-like regions 91 can be controlled in accordance with the molecular weight of PMMA and the arrangement pitches can be controlled in accordance with the molecular weight of PMMA and the molecular weight of PS. By appropriately setting the molecular weights of PMMA and PS and the ratio between them, the island-like regions 91 of a roughly spherical shape or columnar shape can be regularly arranged. Typically, the regions can be arranged in such a manner that lines which connect the centers of the regions make a roughly regular triangle shape.

Figure 6:
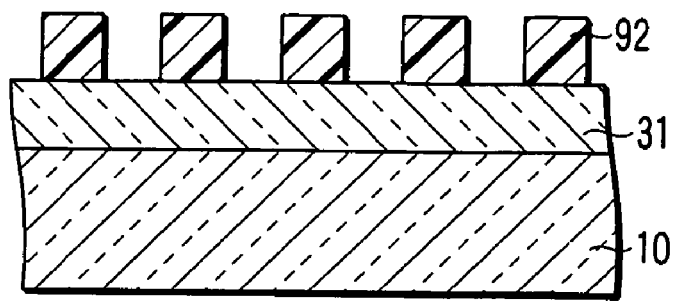
FIG. 6 is a cross sectional view schematically showing an example of the method of manufacturing an outcoupling layer.

After that, the organic layer 90 is subjected to etching such as RIE (reactive ion etching). Here, by utilizing the difference between PMMA and PS in resistance to etching, the island-like regions 91 are removed and the ocean-like region 92 is left to remain as shown in FIG. 6.

Figure 7:
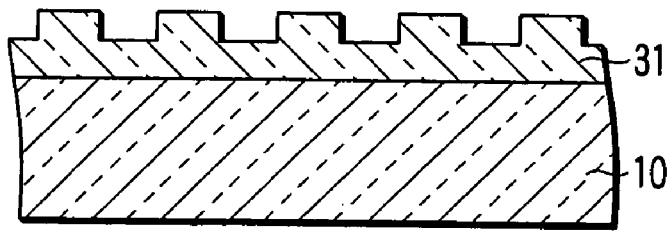
FIG. 7 is a cross sectional view schematically showing an example of the method of manufacturing an outcoupling layer.

Next, the SiN film 31 is subjected to patterning with use of the ocean-like region 92 as a mask as shown in FIG. 7. More specifically, openings spaced apart from one another are formed in the SiN film 31 to obtain the first portion. Subsequently, the ocean-like region 92 is removed from the SiN film 31 which is the first portion.

Further, a layer having optical properties such as refractive index different from those of the first portion 31, for example, a flattening resin film having a refractive index different from that of the SiN film is formed as the second portion 32 on the first portion 31 to fill the openings formed in the first portion 31. Thus, the outcoupling layer 30 is obtained.

According to the method, the dimensions of the openings in the first portion 31 and the distance between the centers of the openings can be controlled in accordance with the molecular weights of PMMA and PS. In other words, the dimensions and arrangement of the openings in the first portion 31 can be controlled on the molecular level.

Further, in the method, a photomask is not used in the formation of the openings in the first portion 31, but the self-organization of the blockcopolymer is utilized. In the case where an extremely fine pattern is to be formed, a method which uses a photomask entails such a drawback that the manufacture of the photomask itself is difficult. Further, in the case where an extremely fine pattern is to be formed, a method which uses a photomask entails such a drawback that it is difficult to transfer the pattern of the photomask with a high accuracy. Particularly, in the case of an oversized substrate, it is difficult to form an oversized mask having a very fine pattern. In contrast, the method which utilizes the self-organization of a block copolymer can avoid these problems.

As described above, the outcoupling layer 30 which is used in the organic EL display 1 according to this embodiment can be easily manufactured even in the case where the dimensions of the openings in the first portion 1 and the distance between the centers of the openings are small. Therefore, according to the present embodiment, it is possible to sufficiently prevent the light incident on the transparent substrate 10, which is the light transmitting insulating layer, from being totally reflected by the interface between the light transmitting insulating layer and the external environment, and therefore a sufficiently high luminous efficiency can be realized.

Note that when the first portion 31 and second portions 32 are different from each other in optical characteristics other than the refractive index, the refractive indices of the first portion 31 and the second portions 32 need not differ from each other. For example, as long as the effects similar to the above can be obtained, the first portion 31 and second portions 32 may be different from each other in optical properties such as transmittance and reflectance.

The outcoupling layer 30 may further contain another layer serving as a third portion which faces the first portion 31 and is made of the same material as that of the second portions 32. In this case, the second portions 32 may be in contact with the third portion. Further, the openings in the outcoupling layer 30 may be through holes.

The above described outcoupling layer 30 exhibits the following characteristics resulting from its manufacturing method.

For example, in the outcoupling layer 30 obtained by the above described method, the openings made in the first portion 31 are usually arranged such that lines which connect the centers of the openings make a roughly regular triangle shape. In other words, the array of the second portion 32 forms a triangular lattice.

Further, in the outcoupling layer 30 obtained by the above described method, the openings formed in the first portion 31 usually have circular shapes. That is, when viewed from a direction perpendicular to the main surface of the outcoupling layer 30, each second portion 32 has a roughly circular shape.

Most typically, in the outcoupling layer 30 obtained by the above described method, the openings formed in the first portion 31 are arranged such that lines which connect the centers of the openings make a roughly regular triangle shape, and the openings have circular shapes. In other words, the array of the second portion 32 forms a triangular lattice, and when viewed from a direction perpendicular to the main surface of the outcoupling layer 30, each second portion 32 has a roughly circular shape.

The formation of the outcoupling layer 30 by the method illustrated in FIGS. 3 to 8 is described above. The outcoupling layer 30 can be formed by other methods.

Figure 5:
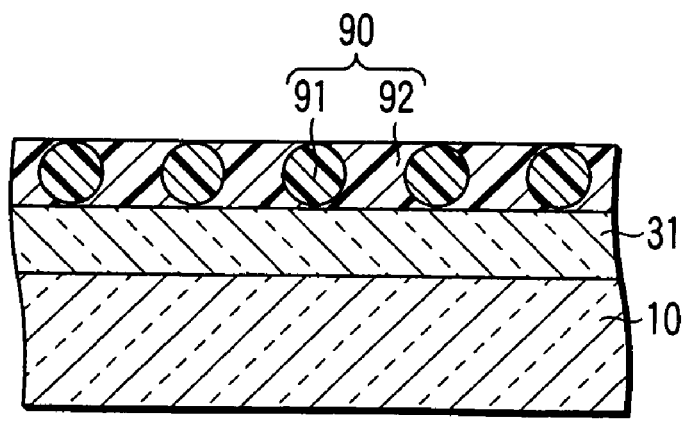
FIG. 5 is a cross sectional view schematically showing an example of the method of manufacturing an outcoupling layer.

For example, the outcoupling layer 30 can be formed by carrying out the steps described with reference to FIGS. 4 to 6, and filling the openings of the ocean-like region 92 with a material having optical properties different from those of the ocean-like region 92. In other words, the ocean-like region 92 can be utilized as the first portion 31. Note that the outcoupling layer 30 obtained by the method has substantially the same structure as that of the outcoupling layer 30 obtained by the method illustrated in FIGS. 3 to 8.

Alternatively, the outcoupling layer 30 can be formed by carrying out the steps described with reference to FIGS. 4 and 5. In this case, the organic layer 90 shown in FIG. 5 can be utilized as the outcoupling layer 30. In other words, the ocean-like region 92 and island-like region 91 can be utilized as the first portion 31 and second portion 32, respectively. Note that the outcoupling layer 30 obtained by the method has substantially the same structure as that of the outcoupling layer 30 obtained by the method illustrated in FIGS. 3 to 8.

With this technique, the directivity of the light output from the transparent substrate 10 is significantly enhanced as described above. The directivity of the light can be freely changed with use of the light scattering layer 60 in accordance with the usage of the organic EL display 1. For example, in the case where the organic EL display 1 is used in a mobile device such as a mobile telephone, the organic EL display 1 is not required to have a wide viewing angle, but it requires to have a bright display or a low power consumption. Therefore, for this particular usage, a light scattering layer 60 that has a low light scattering capability may be used. On the other hand, in the case where the organic EL display 1 is utilized as a display for a stationary device, the organic EL display 1 is required to have a wide viewing angle. Therefore, for this particular usage, a light scattering layer 60 that has a high light scattering capability may be used.

Next, the second embodiment of the present invention will be described.

Figure 9:
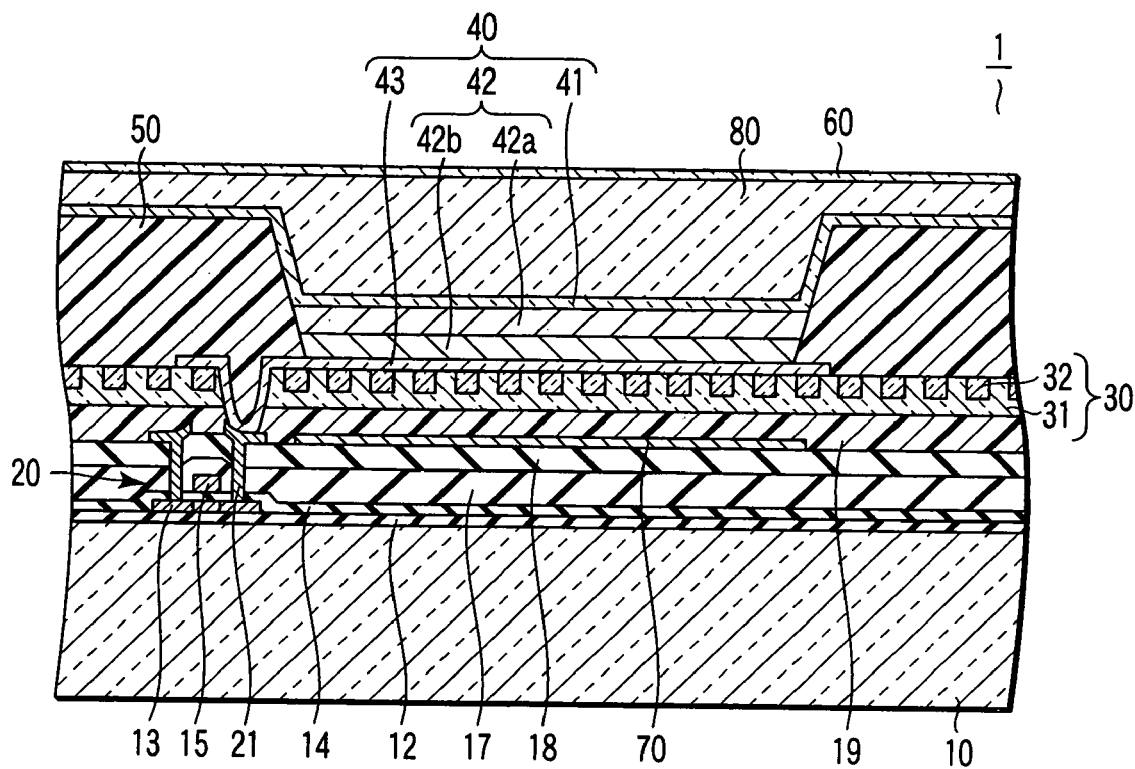
FIG. 9 is a sectional view schematically showing a portion of an organic EL display according to the second embodiment of the present invention.

FIG. 9 is a cross sectional view schematically showing the organic EL display according to the second embodiment of the present invention. In FIG. 9, the organic EL display 1 is illustrated such that its front surface faces upward and the back surface faces downward.

The organic EL display 1 is a top emission type organic EL display. Therefore, unlike the first embodiment, the substrate 10 need not have a light transmission property.

As in the case of the first embodiment, an undercoat layer 12, TFTs, an interlayer insulating film 17 and a passivation film 18 are formed in this order. Contact holes are formed in a gate insulator 14, the interlayer insulating film 17 and the passivation film 18, and source and drain electrodes 21 are electrically connected to the source and drain of the TFT via the contact hole.

On the interlayer insulating film 17, a reflecting layer 70 and a first portion 31 of a outcoupling layer 30 are arranged in this order. In this example, the first portion 31 is formed to be integrated with the passivation film. As the material of the reflecting layer 70, for example, a metal material such as Al can be used. Here, the reflecting layer 70 has a three-layer structure of Mo/Al/Mo so that it can be formed in the same step as that for the source and drain electrode 21. Further, as the material of the first portion 31, for example, an insulating material such as SiN can be used.

Recesses of the first portion are filled with a second portion 32 made of a light transmitting insulating material having a refractive index different from that of the first portion 31, such as a resist material.

Back electrodes 43 with light transmission property are arranged on the outcoupling layer 30 and are spaced apart from one another. In this example, each back electrode 43 is an anode and is made of a transparent insulating oxide such as ITO.

A partition insulating layer 50 similar to that described in the first embodiment is formed on the outcoupling layer 30. On the portion of the back electrode 43 which is exposed to a space in a through hole of the partition insulating layer 50, an organic layer 42 which includes an emitting layer 42a is arranged as in the first embodiment.

A front electrode 41 with light-transmission property is arranged on the partition insulating layer 50 and organic layer 42. In this example, the front electrode 41 is a cathode which is continuously formed and common to all pixels. Further, in this example, the organic EL element 40 corresponds to the first waveguide layer.

A transparent protective film 80 which is a light transmitting insulating layer and a light scattering layer 60 are arranged in this order on the front electrode 41. In this example, the transparent protective layer 80 corresponds to the second waveguide layer. The transparent protective layer 80 inhibits, for example, the enter of moisture from the external environment into the organic EL element 40 and serves as a flattening layer. As the material of the transparent protective layer 80, a transparent resin can be used. Further, the transparent protective layer 80 may employ a single layer structure or multi-layer structure.

A polarizer may be arranged between the transparent protective layer 80 and the light-scattering layer 60. Further, an ND filter may be arranged on the light scattering layer 60.

In the first embodiment, the outcoupling layer 30 is arranged between the organic EL element 40 and the transparent substrate 10 which is a light transmitting insulating layer, that is, on the front side of the organic EL element 40. In contrast, in the second embodiment, the outcoupling layer 30 is arranged between the organic EL element 40 and the reflecting layer 70, that is, on the back side of the organic EL element 40. Even with this structure employed in the second embodiment, substantially the same effect as that described in the first embodiment can be obtained.

It should be noted that when the outcoupling layer 30 is arranged on the back side of the organic EL element 40, a portion of the light emitted by the organic EL element 4 enters the light transmitting insulating layer without passing through the outcoupling layer 30. Therefore, in order to diffract more light beams, it is more advantageous that the outcoupling layer 30 is arranged between the organic EL element 40 and the light transmitting insulating layer.

As described above, the optical properties of the second portion 32 should be different from those of the first portion 31. It suffices if the first portion 31 and second portions 32 are different in at least one of the refractive index, transmittance and reflectance. Typically, the second portions 32 have light transmission property and have a different refractive index from that of the first portion 31.

At least one of the first portion 31 and second portion included in the outcoupling layer 30 may have a higher refractive index as compared to that of a layer adjacent thereto on the side of the organic EL element 40. With this structure, the multiple-beam interference in the layer located on the side of the organic EL element 40 with respect to the outcoupling layer 30 is promoted.

An example of the present invention will now be described.

EXAMPLE

In this example, the organic EL display 1 shown in FIG. 1 was manufactured by the following method.

Firstly, the film formation and patterning are repeated in a similar manner to that of a regular TFT formation process on a surface of a glass substrate 10 on which an undercoat layer 12 was formed, thereby forming a TFT 20, an interlayer insulating film 17, an electrode wiring (not shown), source and drain electrodes 21 and a passivation film 18.

Next, as shown in FIG. 3, an SiN film 31 having a thickness of 100 nm was formed on the passivation film 24.

Then, a coating solution obtained by dissolving a diblock-copolymer of PS and PMMA into PGMEA was applied on the SiN film 31 by spin coating. Here, the concentration of the blockcopolymer in the PGMEA was set to 2% by weight. Subsequently, by baking at 110° C., the solvent was removed from the coated film. In this manner, an organic layer 90 as shown in FIG. 4 was formed.

After that, the organic layer 90 was annealed in a nitrogen atmosphere at 210° C. for 4 hours, and subsequently annealed at 135° C. for 40 hours. Thus, as shown in FIG. 5, the island-like regions 91 made of PMMA and the ocean-like region 92 made of PS were produced in the organic layer 90.

Next, the organic layer 90 was subjected to RIE, by which the island-like regions 91 were removed while the ocean-like region 92 was left to be remained as shown in FIG. 6.

Subsequently, as shown in FIG. 7, the SiN film 31 was patterned with use of the ocean-like region 92 as a mask. That is, openings spaced apart from one another were formed in the SiN film 31, thereby forming a first portion, and then the ocean-like region 92 was removed from the SiN film 31, which was then the first portion.

Figure 8:
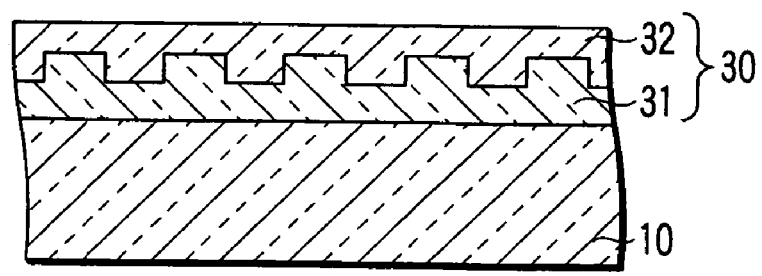
FIG. 8 is a cross sectional view schematically showing an example of the method of manufacturing an outcoupling layer.

Further, as shown in FIG. 8, an acrylic resin film having a thickness of 100 nm was formed as a second portion 32 on the first portion 31, and thus the openings formed in the first portion 31 were filled. In this manner, a outcoupling layer 30 was obtained. That is, in this example, the outcoupling layer 30 in which the first portion 31 and second portion 32 are both made of transparent materials, and the difference between the first portion 31 and second portion 32 in refractive index was 0.3 or more, was obtained.

Next, ITO was deposited on the outcoupling layer 30 with use of a mask sputtering method, thus obtaining a front electrode 41.

Then, a photosensitive resin was applied on the surface of the substrate 11 on which the front electrode 41 was formed. The coated film obtained was subjected to pattern exposure and development, thereby forming a water-repellent partition insulating layer 50 having openings at positions corresponding to the light emitting portions of the pixels. The substrate 10 on which the partition insulating layer 50 was formed was surface-treated with use of $CF_4/O_2$ plasma gas, thereby fluorinating the surface of the partition insulating layer 50.

Subsequently, a buffer layer-forming ink was discharged by an ink jet method into liquid reservoirs which the partition insulating layer 50 formed, thereby forming a liquid film in each reservoir. Then, each liquid film was heated at a temperature of 120° C. for 3 minutes, thereby obtaining a buffer layer 42b. Here, the thickness of the buffer layer 42b was set to 30 nm and the refractive index was set to 1.9.

After that, an emitting layer-forming ink was discharged onto each buffer layer 42b by an ink jet method, thereby forming a liquid film. Then, each liquid film was heated at a temperature of 90° C. for 1 hour, thereby obtaining an emitting layer 42a. Here, the thickness of the emitting layer 42a was set to 200 nm and the refractive index was set to 1.8.

Next, barium was deposited by vacuum evaporation on the surface of the substrate 11 on which the emitting layer 42a was formed, and then aluminum was deposited by evaporation, thereby forming a back electrode 43. Thus, a TFT array substrate was completed.

After that, an ultraviolet-curing resin was applied on a periphery of a main surfaces of a glass substrate (not shown), which was separately prepared, to form a sealing layer (not shown). Then, this glass substrate and the above-described array substrate were adhered together in an inert gas atmosphere such that the surface on which the sealing layer was arranged and the surface on which the back electrode 43 was arranged face each other. Further, the sealing layer was cured with ultraviolet radiation, and a light scattering film 60 was adhered on the outer surface of the substrate 10. Thus, the organic EL display 1 shown in FIG. 1 was completed.

FIG. 10 is an atomic force microscope photograph of the outcoupling layer of the organic EL display according to the example of the present invention. The photo shown in FIG. 10 was taken before the formation of the second portions 32.

As shown in FIG. 10, openings each having substantially circular shape were formed in the first portion 31 of the outcoupling layer 30. Each opening had a diameter of about 200 nm, and the openings were regularly arranged such that lines which connect the centers of adjacent openings form regular triangles with a side having a length of about 400 nm. That is, the array of the second portions 23 forms a triangular lattice when it is viewed from a direction perpendicular to the main surface of the outcoupling layer 30. Each of the second portions 32 was substantially circular when viewed from a direction perpendicular to the main surface of the outcoupling layer 30.

Comparative Example

An organic EL display 1 was manufactured by a similar method to that described in the above example, except that the outcoupling layer 30 and light scattering film 60 were not provided.

Then, the organic EL displays according to the example of the present invention and the comparative example were measured in terms of the luminous energy output to the external environment under the same conditions. As a result, the luminous energy obtained by the organic EL display 1 according to the example of the present invention was about 2.5 times as much as the luminous energy obtained by the organic EL display 1 according to the comparative example. Thus, it was confirmed that the organic EL display 1 according to the example of the present invention exhibits a higher luminous efficiency as compared to the organic EL display 1 according to the comparative example.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An organic EL display comprising:
    an organic EL element which comprises a front electrode, a back electrode facing the front electrode, and an organic layer interposed between the front and back electrodes and including an emitting layer;
    a thin-film transistor;
    a source electrode connected to a source of the thin-film transistor;
    a drain electrode connected between a drain of the thin-film transistor and one of the front and back electrodes;
    an insulating layer with light transmission property which comprises a back surface facing the front electrode and a front surface as a light output surface; and
    an outcoupling layer which is disposed on a back side of the insulating layer, faces the organic EL element, overlies the source and drain electrodes, and is provided with a through-hole through which the front or back electrode is connected to the drain electrode,
    wherein the outcoupling layer comprises a first portion as a layer with light transmission property and second portions which are dispersed in the first portion and differ in optical property from the first portion, and wherein an array of the second portions forms a triangular lattice.

2. The display according to claim 1, wherein each of the second portions is substantially circular when viewed from a direction perpendicular to a main surface of the outcoupling layer.

3. The display according to claim 1, wherein the first portion is provided with apertures, and wherein the apertures are filled with the second portions, respectively.

4. The display according to claim 1, wherein the second portions differ in refractive index from the first portion.

5. The display according to claim 1, wherein the outcoupling layer is interposed between the insulating layer and the front electrode.

6. The display according to claim 1, further comprising a reflecting layer disposed on a back side of the back electrode, wherein the back electrode has light transmission property.

7. The display according to claim 6, wherein the outcoupling layer is interposed between the back electrode and the reflecting layer.

8. The display according to claim 1, wherein the insulating layer includes a transparent substrate.

9. The display according to claim 1, wherein the insulating layer includes a transparent protective layer.

10. The display according to claim 1, wherein a surface of the outcoupling layer which faces the organic EL element is flat.

11. The display according to claim 1, wherein the outcoupling layer is configured to enhance directivity of light output from the front surface of the insulating layer.

12. The display according to claim 1, wherein each of the second portions has a columnar shape.

13. An organic EL display comprising:
    an organic EL element which comprises a front electrode, a back electrode facing the front electrode, and an organic layer interposed between the front and back electrodes and includes an emitting layer;
    a thin-film transistor;
    a source electrode connected to a source of the thin-film transistor;
    a drain electrode connected between a drain of the thin-film transistor and one of the front and back electrodes;
    an insulating layer with light transmission property which comprises a back surface facing the front electrode and a front surface as a light output surface; and
    an outcoupling layer which is disposed on a back side of the insulating layer, faces the organic EL element, overlies the source and drain electrodes, and is provided with a through-hole through which the front or back electrode is connected to the drain electrode,
    wherein the outcoupling layer comprises a first portion as a layer with light transmission property and second portions which differ in optical property from the first portion.

14. The display according to claim 13, wherein the outcoupling layer is configured to enhance directivity of light output from the front surface of the insulating layer.

15. The display according to claim 13, wherein each of the second portions has a columnar shape.

* * * * *